(12) United States Patent
Cousins (10) Patent No.: US 8,409,911 B2
(45) Date of Patent: Apr. 2, 2013

(54) METHODS FOR METALLIZATION OF SOLAR CELLS

(75) Inventor: Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 912 days.

(21) Appl. No.: 12/534,212

(22) Filed: Aug. 3, 2009

(65) Prior Publication Data

US 2010/0218800 A1    Sep. 2, 2010

Related U.S. Application Data

(63) Continuation-in-part of application No. 12/392,003, filed on Feb. 24, 2009.

(51) Int. Cl.
*H01L 21/00* (2006.01)
(52) U.S. Cl. ............... 438/98; 438/72; 438/81; 438/97; 136/252; 136/256
(58) Field of Classification Search .............. 438/71, 438/80, 57, 83, 97–98; 136/265, 246–249
See application file for complete search history.

(56) References Cited

U.S. PATENT DOCUMENTS

| | | |
|---|---|---|
| 3,961,997 A | 6/1976 | Chu |
| 4,478,879 A | 10/1984 | Baraona et al. |
| 4,927,770 A | 5/1990 | Swanson |
| 5,053,083 A | 10/1991 | Sinton |
| 5,057,439 A | 10/1991 | Swanson et al. |
| 5,164,019 A | 11/1992 | Sinton |
| 5,217,539 A | 6/1993 | Fraas et al. |
| 5,360,990 A | 11/1994 | Swanson |
| 5,369,291 A | 11/1994 | Swanson |
| 5,641,362 A | 6/1997 | Meier |

(Continued)

FOREIGN PATENT DOCUMENTS

| | | |
|---|---|---|
| WO | WO 02/45143 A1 | 6/2002 |
| WO | WO 2009/032021 A2 | 3/2009 |
| WO | WO 2009/128721 A2 | 10/2009 |

OTHER PUBLICATIONS

Directory: Sliver Solar Cells from PESWiki, 7 sheets, webpage [online][retrieved on Apr. 17, 2009]. Retrieved from the internet: http://peswiki.com/index.php/Directory:Sliver_Solar_Cells.

(Continued)

*Primary Examiner* — Dung A. Le
(74) *Attorney, Agent, or Firm* — Okamoto & Benedicto LLP (57) ABSTRACT

A method for metallization of solar cells is disclosed. The method includes providing a superstrate, such as a sheet of polymer film, to be used as a transport during metallization of solar cells. The method includes attaching the back sides of the solar cells to the sheet of polymer film. The method also includes forming contact holes through the sheet of polymer film to expose doped regions of the solar cells. The method also includes forming metals in the contact holes to electrically connect to the exposed doped regions of the solar cells. The method further includes electroplating the metals to form metal contacts of the solar cell. Subsequently, the method also includes separating the solar cells from other solar cells that were metallized while supported by the same sheet of polymer film to form strings of solar cells or individual solar cells.

13 Claims, 10 Drawing Sheets

U.S. PATENT DOCUMENTS

| | | | |
|---|---|---|---|
| 6,096,968 | A | 8/2000 | Schlosser et al. |
| 6,274,402 | B1 | 8/2001 | Verlinden et al. |
| 6,278,054 | B1 | 8/2001 | Ho et al. |
| 6,313,395 | B1 | 11/2001 | Crane et al. |
| 6,333,457 | B1 | 12/2001 | Mulligan et al. |
| 6,337,283 | B1 | 1/2002 | Verlinden et al. |
| 6,387,726 | B1 | 5/2002 | Verlinden et al. |
| 6,423,568 | B1 | 7/2002 | Verlinden et al. |
| 6,548,751 | B2 | 4/2003 | Sverdrup, Jr. et al. |
| 6,552,414 | B1 | 4/2003 | Horzel et al. |
| 6,872,321 | B2 | 3/2005 | Thavarajah et al. |
| 6,998,288 | B1 | 2/2006 | Smith et al. |
| 7,135,350 | B1 | 11/2006 | Smith et al. |
| 2003/0076649 | A1 | 4/2003 | Speakman |
| 2004/0058468 | A1 | 3/2004 | Takahashi et al. |
| 2004/0200520 | A1 | 10/2004 | Mulligan et al. |
| 2005/0272225 | A1 | 12/2005 | Weber et al. |
| 2007/0137692 | A1* | 6/2007 | Carlson .......... 136/252 |
| 2007/0150244 | A1 | 6/2007 | Senecal et al. |
| 2007/0151599 | A1 | 7/2007 | Cousins |
| 2007/0249140 | A1 | 10/2007 | Dross et al. |
| 2007/0269750 | A1 | 11/2007 | Irving et al. |
| 2007/0277810 | A1 | 12/2007 | Stock |
| 2007/0277869 | A1 | 12/2007 | Shan et al. |
| 2008/0072953 | A1 | 3/2008 | Stephens et al. |
| 2008/0108171 | A1 | 5/2008 | Rogers et al. |
| 2008/0223429 | A1 | 9/2008 | Everett et al. |
| 2008/0251121 | A1* | 10/2008 | Stone ............ 136/256 |
| 2008/0257403 | A1 | 10/2008 | Edmonds |
| 2008/0264465 | A1 | 10/2008 | Kerr et al. |

OTHER PUBLICATIONS

About SLIVER—Origin Energy Australia, 2 sheets [retrieved on Nov. 11, 2009]. Retrieved from the internet: http://www.originenergy.com.au/1234/About-SLIVER.

W.P. Mulligan, et al., "A Flat-Plate Concentrator: Micro-Concentrator Design Overview", 2000, 3 sheets, Proceedings of the 28th IEEE PVSC.

K. R. McIntosh, et al., "The Choice of Silicon Wafer for the Production of Low-Cost Rear-Contact Solar Cells", May 2003, 4 sheets, Sunpower Corporation, Sunnyvale, CA.

P.J. Verlinden, et al., " Will We have a 20%-Efficient(PTC) Photovoltaic System?", 2001, 6 sheets, Proceedings of the 17th Europe Photovoltaic Solar Energy Conference.

William P. Mulligan, et al., " Development of Chip-Size Silicon Solar Cells", 2000, 6 sheets, Proceedings of the 28th IEEE PVSC.

Akira Terao, et al., "A Mirror-Less Design for Micro-Concentrator Modules", 2000, 4 sheets, Proceedings of the 28th IEEE PVSC.

P.J. Verlinden, et al., "Backside-Contact Silicon Solar Cells with Improved Efficiency for the '96 World Solar Challenge", 1997, 5 sheets, Proceedings of the 15th EPSEC.

P.J. Verlinden, et al., "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson "The Promise of Concentrators", 2000, Prog. Photovolt. Res. Appl. 8, pp. 93-111, Sunpower Corporation.

Onald A. Sinton, et al., "Simplified Backside-Contact Solar Cells", Feb. 1990, pp. 348-352, IEEE Transactions on Electron Devices, vol. 37. No. 2.

Ronald A. Sinton "Device Physics and Characterization of Silicon Point-Contact Solar Cells", Feb. 1997, pp. 1-154, Stanford Electronics Laboratories, Stanford University, CA.

Richard Roland King "Studies of Oxide-Passivated Emitters in Silicon and Applications to Solar Cells", Aug. 1990, pp. 1-200, (Thesis) Electrical Engineering Department of Stanford University, CA.

PCT International Search Report for Application No. PCT/US2010/036068, Jul. 30, 2010 (2 sheets).

* cited by examiner

METHODS FOR METALLIZATION OF SOLAR CELLS

CROSS-REFERENCE TO RELATED APPLICATION

This application is a continuation-in-part of U.S. application Ser. No. 12/392,003, filed on Feb. 24, 2009.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. Sliver cells are solar cells manufactured from thin slivers of monocrystalline silicon. Currently available sliver cells are manufactured by micro machining narrow grooves that extend through a thickness of a silicon wafer. Solar cells are manufactured on the resulting strips, i.e., slivers, cut from the wafer. This allows sliver cells to be manufactured using less silicon compared to other solar cell designs. Sliver cells are available from Origin Energy of Australia.

The present disclosure pertains to methods and apparatus for metallization of back contact sliver cells and other solar cells.

SUMMARY

In one embodiment, a superstrate in the form of a sheet of polymer film is used as a transport during metallization of solar cells. The back sides of the solar cells are attached to the sheet of polymer film. Contact holes are formed through the sheet of polymer film to expose doped regions of the solar cells. Metals are formed in the contact holes to electrically connect to the exposed doped regions of the solar cells. The metals are electroplated to form metal contacts of the solar cell. Subsequently, the solar cells are separated from other solar cells that were metallized while supported by the same sheet of polymer film to form strings of solar cells or individual solar cells.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components. The drawings are not to scale.

DETAILED DESCRIPTION

In the present disclosure, numerous specific details are provided, such as examples of materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, masking steps and other processing steps not necessary to the understanding of the invention have been omitted in the interest of clarity.

FIGS. 1-9 show cross-sections schematically illustrating a method of manufacturing solar cells in accordance with an embodiment of the present invention. Because of the dimensions involved, FIGS. 1-9 and the rest of the figures in this disclosure are not to scale. As will be more apparent below, the resulting solar cells are back contact sliver cells in that the metal contacts for electrically coupling an external electrical circuit to doped regions of the solar cells are on a back side of the slivers. The front side of the slivers is opposite the back side. The front side is also referred to as the "sun side" because it is configured to face the sun to collect solar radiation during normal operation.

Figure 1:
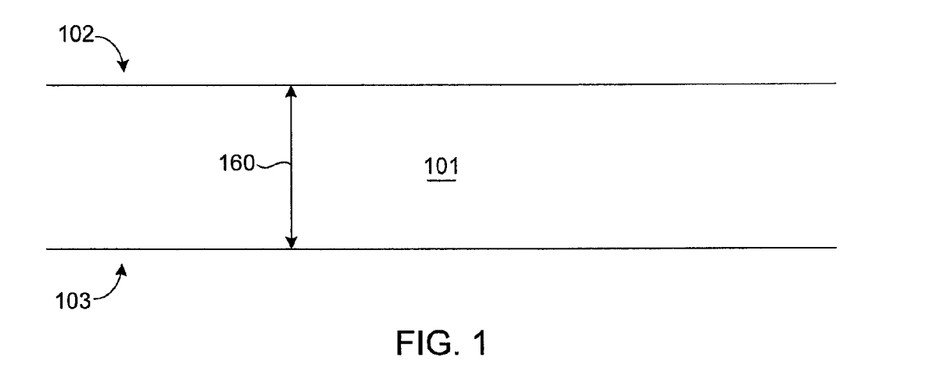
FIGS. 1-9 show cross-sections schematically illustrating a method of manufacturing solar cells in accordance with an embodiment of the present invention.

Referring to FIG. 1, an N-type monocrystalline silicon wafer 101 is prepared for processing into a back contact sliver cell by undergoing a damage etch step. The wafer 101 is in wafer form in this example, and is thus typically received with damaged surfaces due to the sawing process used by the wafer vendor to slice the wafer 101 from its ingot. The wafer 101 may be about 100 to 200 microns thick as received from the wafer vendor. In one embodiment, the damage etch step involves removal of about 10 to 20 μm from each side of the wafer 101 using a wet etch process comprising potassium hydroxide. The damage etch step may also include cleaning of the wafer 101 to remove metal contamination. The opposing flat sides of the wafer 101 are labeled as 102 and 103. The thickness of the wafer 101 is labeled as 160. As will be more apparent below, the front side of the sliver cells comprises a surface from along the thickness of the wafer 101, which serves as the solar cell substrate.

Figure 2:
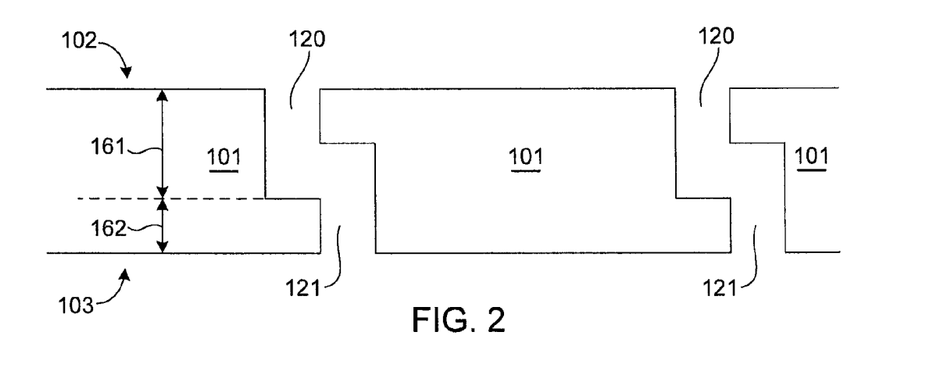

In FIG. 2, offset trenches 120 and 121 are formed in the sample of FIG. 1. The offset trenches may be formed by any suitable etching process. The wafer side 103 may be masked off during etching of the wafer 101 to form the trenches 120.

Thereafter, the wafer side 102 may be masked off during etching of the wafer 101 to form the trenches 121. In the example of FIG. 2, the trenches 120 and 121 do not go through the thickness of the wafer 101. The trenches 120 and 121 stop within the thickness of the wafer 101 to create a stepped bottom surface in each of the trenches. The trenches 120 and 121 also include wall surfaces from along the thickness of the wafer 101. By offsetting the trenches 120 and 121 on opposite sides of the wafer 101, portions of the wafer 101 are separated, with each portion having the stepped bottom surfaces. The ratio of dimensions 161 and 162 may be chosen depending on design parameters. For example, the dimension 161 may be two-thirds (⅔) of the thickness of the wafer, while the dimension 162 may be one-third (⅓) of the thickness of the wafer.

In a typical sliver cell process, a vertical sliver is made by cutting or etching a trench straight through the thickness of a silicon wafer. This approach, however, makes it difficult to form selective diffusions on resulting wall surfaces because of the masking that would be required. By offsetting the trenches 120 and 121, line of sight processing to form films on the trench sidewalls becomes feasible. This advantageously allows the sliver cell to be readily manufactured, greatly increasing the chance of sliver cells to become more competitive as a renewable energy source.

Figure 3:
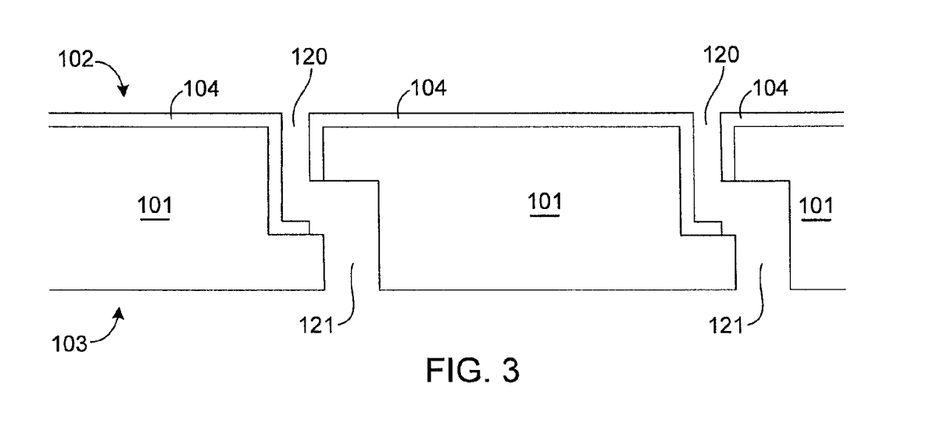

In FIG. 3, an N-type dopant source in the form of a doped silicon dioxide layer 104 is formed on exposed surfaces of the wafer 101 on the wafer side 102. In one embodiment, the silicon dioxide layer 104 is doped with phosphorus. A line of sight deposition process, such as atmospheric pressure chemical vapor deposition (APCVD), may be used to deposit the silicon dioxide layer 104 to a thickness of about 1000 to 4000 Angstroms, preferably approximately 2400 Angstroms.

In an alternative embodiment, instead of forming the silicon dioxide layer 104 on the exposed surfaces of the wafer 101, a first doped silicon dioxide layer is deposited on the exposed surfaces of the wafer 101 on the wafer side 102. The first doped silicon dioxide layer may be deposited to a thickness of about 200 to 600 Angstroms, preferably approximately 400 Angstroms. A first undoped silicon dioxide layer is then deposited directly on top of the first doped silicon dioxide layer to a thickness of about 2000 to 4000 Angstroms, preferably approximately 2000 Angstroms. The first undoped oxide layer serves as a capping layer in the case of chemical etching performed to texture the sun side surface of the resulting sliver solar cell.

Figure 4:
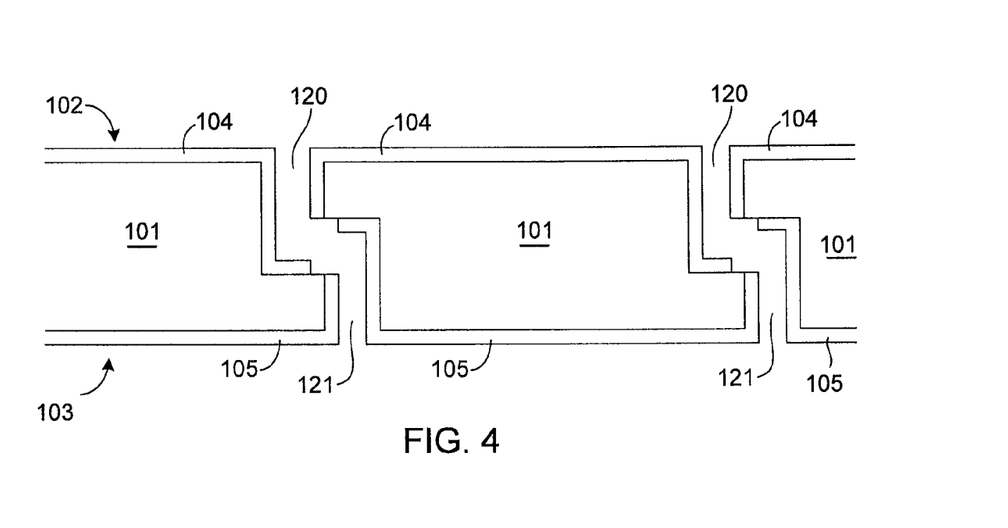

The bottom surfaces of the trenches 120 stop deposition of the silicon dioxide layer 104 on surfaces of the wafer 101 on the opposing wafer side 103. As shown in FIG. 4, this allows deposition of a P-type dopant source in the form of a doped silicon dioxide layer 105 to be formed on exposed surfaces on the wafer side 103. In one embodiment, the silicon dioxide layer 105 is doped with boron. The bottom surfaces of the trenches 121 stop deposition of the silicon dioxide layer 105 on surfaces on the opposing side 102. This greatly simplifies the masking steps needed to form the dopant sources. A line of sight deposition process, such as APCVD, may be used to deposit the silicon dioxide layer 105 to a thickness of about 1000 to 4000 Angstroms, preferably approximately 2400 Angstroms. Instead of forming a single silicon dioxide layer 105, a first thin doped silicon dioxide layer covered on top by a second thicker undoped silicon dioxide layer (as a capping layer) may be formed on exposed surfaces on the wafer side 103.

Use of a line of sight deposition process advantageously allows for formation of continuous or interrupted trenches at the corners between P-type and N-type regions. Such trenches may allow for increased efficiency while having relatively low reverse-breakdown voltage.

Figure 5:
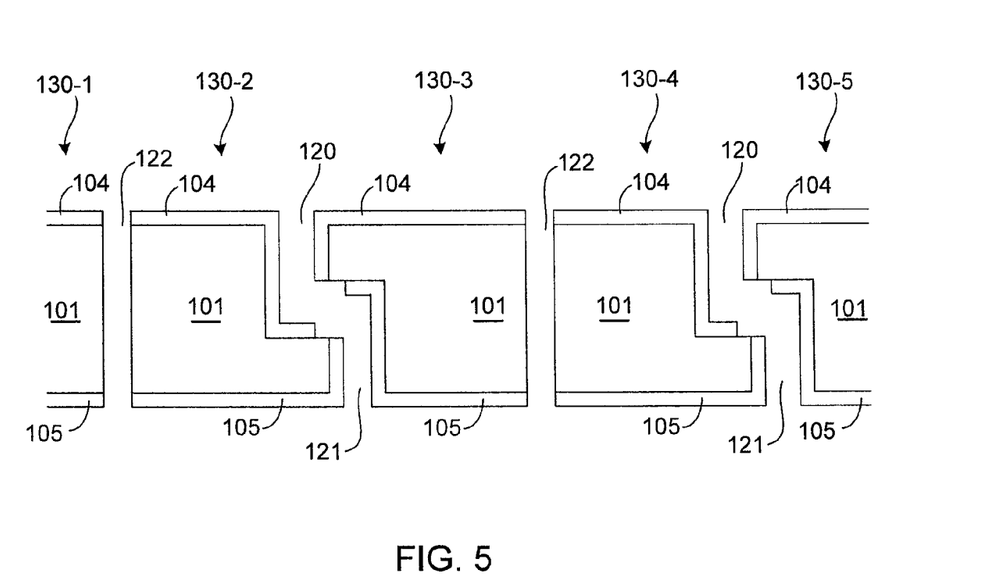
Figure 10:
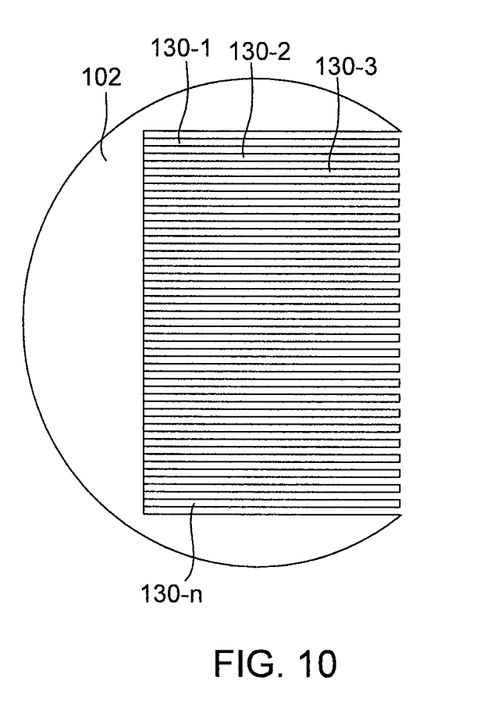
FIG. 10 schematically shows a top view of a wafer being processed into sliver cells in accordance with an embodiment of the present invention.

In FIG. 5, aligned vertical trenches 122 are formed all the way through the thickness of the wafer 101, creating wafer slivers 130 (i.e., 130-1, 130-2, 130-3, . . . ). The aligned vertical trenches 122 may be formed by a suitable etching process, including by laser etching and chemical etching. Selective etching can be performed to leave a particular lattice plane as the final exposed sun side. Each wafer sliver 130 is still attached to the wafer at this time. This is schematically illustrated in FIG. 10, where a top view of the wafer 101 is shown with the wafer side 102 on top. The vertical wall surfaces of the offset trenches 120 and 121, which will be used as back sides of the slivers, are perpendicular to the plane of the page. The slivers 130 may remain attached to one end of the wafer 101 during processing until they are physically separated from the wafer 101 for metallization.

The wall surfaces of the trenches 122, which are perpendicular to the plane of the page of FIG. 10, serve as primary solar radiation collection surfaces of resulting bifacial sliver cells. The wall surfaces of the trenches 122 are going to be configured to face the sun during normal operation. Unlike conventional solar cells where the flat sides of the wafer are used as primary solar radiation collection surfaces, a sliver cell uses wall surfaces along the thickness of the wafer as primary collection surfaces. This advantageously increases the amount of collection surfaces that may be obtained from the wafer.

Figure 6:
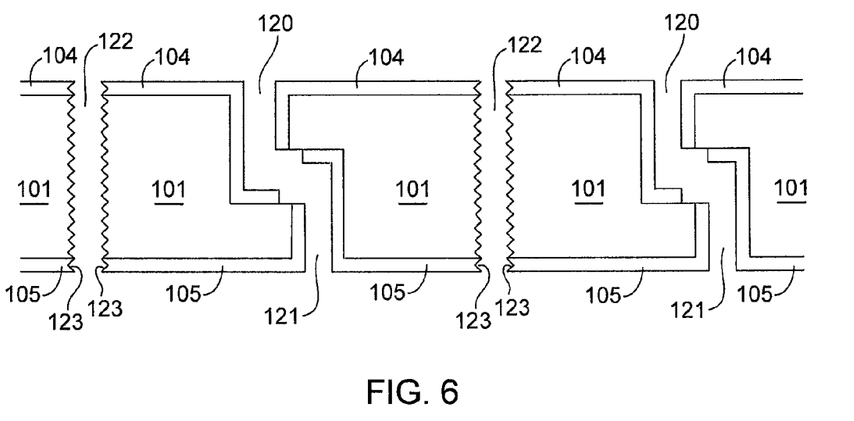

In FIG. 6, the wall surfaces of the trenches 122 are textured for improved solar radiation collection. The textured wall surfaces, labeled as textured surfaces 123, face the sun during normal operation. It is to be noted, however, that the resulting sliver cell is bifacial, i.e., collects solar radiation from both sides of the sliver cell. A textured surface 123 is also referred to as the "front" or "sun" side of the sliver cell. The side opposing the front side is referred to as the back side. In one embodiment, all metal contacts to doped regions of the sliver cell are on the back side for efficiency and aesthetic reasons. The textured surfaces 123 may be formed by plasma etching. Alternatively, the textured surfaces 123 may comprise microstructures etched using a mask having a zigzag pattern.

Figure 7:
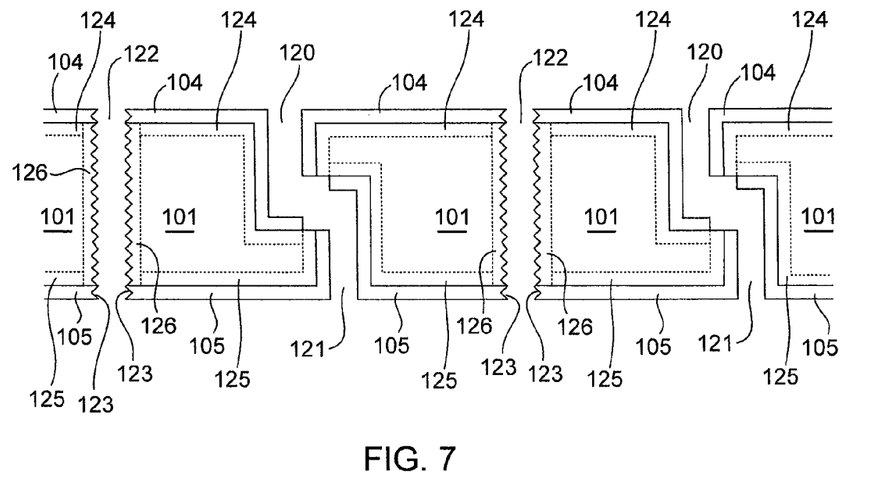

In FIG. 7, front surface fields 126 and doped regions 124 and 125 are formed. The front surface fields 126 and doped regions 124 and 125 may be formed in a thermal drive-in step that subjects the sample of FIG. 6 to high temperature. For example, the sample of FIG. 6 may be heated in a furnace comprising a phosphorus environment. The phosphorus in the furnace diffuses through the front sides of the slivers to form N-type front surface fields 126. The thermal drive-in also diffuses N-type dopants from the doped silicon dioxide 124 into the wafer 101, thereby forming N-type doped regions 124. Similarly, the thermal drive-in step diffuses P-type dopants from the doped silicon dioxide 125 into the wafer 101 to form P-type doped regions 125. Given that that wafer 101 is an N-type silicon wafer in this example, an N-type doped region 124 and a P-type doped region 125 form a base and an emitter, respectively, of the resulting sliver cell. The emitter collects minority charge carriers and the base collects majority charge carriers in the sliver cell. With an N-type silicon wafer 101, electrons are the majority charge carriers and collected in the doped region 124, while holes are the minority charge carriers and collected in the doped region 125.

Figure 8:
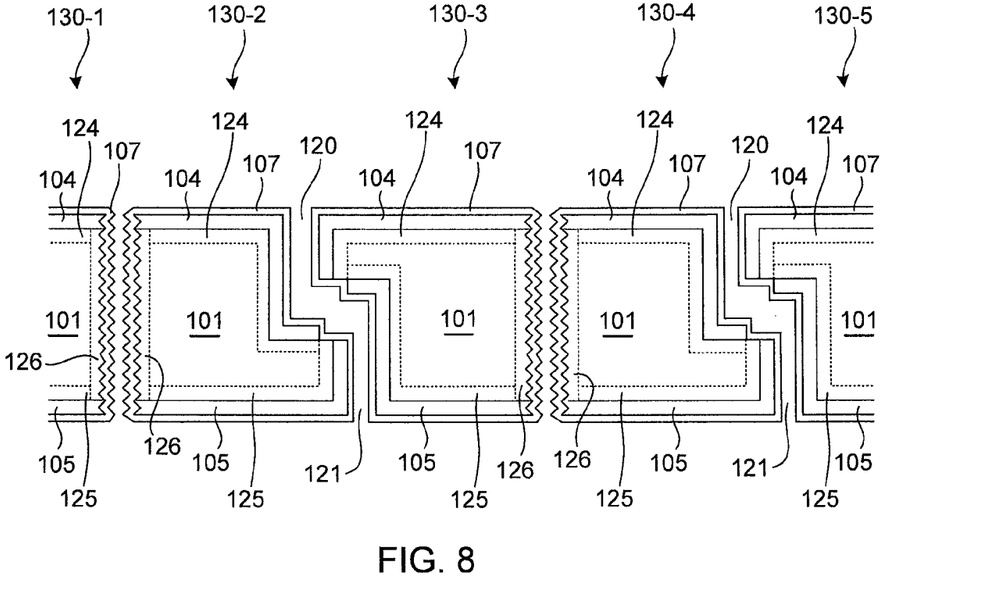

In FIG. 8, an anti-reflective coating (ARC) and moisture barrier in the form of a silicon nitride layer 107 is formed on the surfaces of the sample of FIG. 7. As shown in FIG. 8, the silicon nitride layer 107 covers all the surfaces of each wafer sliver 130. The silicon nitride layer 107 may be formed to a thickness of about 400 to 700 Angstroms, preferably approximately 500 Angstroms, by PECVD, for example.

Through FIG. 8, the slivers 130 may remain attached to one end of the wafer 101 (see FIG. 10). For metallization, each of the slivers 130 may be physically separated from the rest of the wafer 101 by laser or mechanical scribing, for example. This allows metal contacts to be readily formed on the back sides of the resulting sliver cells.

Figure 9:
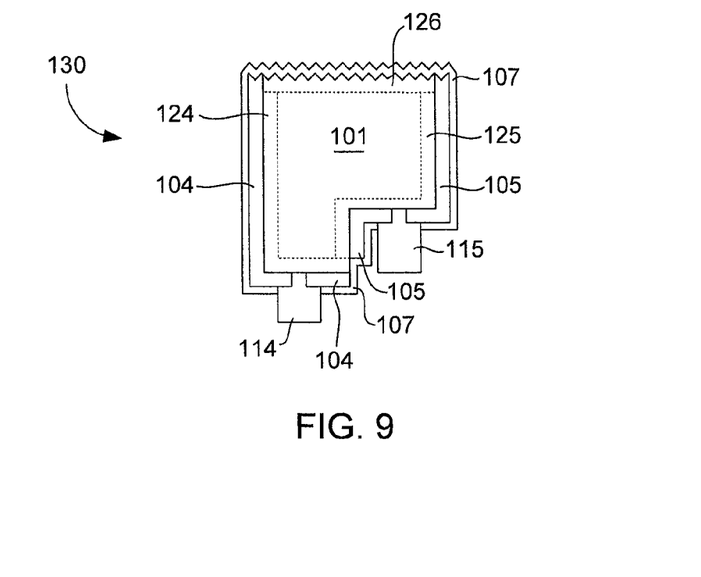

FIG. 9 shows a sliver 130 after it has been physically separated from the rest of the wafer 101. A metal contact 114 is formed in a contact hole going through the silicon nitride layer 107 and silicon dioxide layer 104 to electrically contact the N-type doped region 124. Similarly, a metal contact 115 is formed in a contact hole going through the silicon nitride layer 107 and silicon dioxide layer 105 to electrically contact the P-type doped region 125. The metal contacts 114 and 115 may comprise interdigitated metal contacts, and are formed on the back side of the sliver 130. The absence of a metal contact electrically coupled to a doped region on the front side advantageously allows solar radiation to have a clear path to the front side of the sliver cell. The all back contact design also improves the aesthetics of the sliver cell, which is an important feature in residential applications. The metal contacts 114 and 115 may be coupled to an external electrical circuit that receives electrical current generated by the sliver cell.

Unlike the structure of traditional solar cells, the improved sliver cell of FIG. 9 has a solar cell substrate wherein the front side comprises a surface from along the thickness of the silicon wafer, rather than along the plane of the silicon wafer. When multiple improved sliver cells are placed adjacent to each other with their sun sides oriented on the same plane, there is a greater area of p-n junction interface compared to an equivalent sun facing area of a conventional solar cell. This improved sliver cell structure also differs from conventional sliver cell orientations that use front and back contacts. Conventional sliver cell orientations may introduce shading on the sun side of the cell or have contacts at the longitudinal ends of the sliver cell, forcing the charge carriers to travel a longer distance from the center of the body to the contacts which can result in lower efficiencies. An improved sliver cell may have a width of approximately 1 mm, a length of approximately 10 mm, and height of approximately 50 microns. The improved sliver cell allows for more efficient usage of the wafer, unlike traditional solar cells that have a contiguous front surface from a flat side of the wafer.

Figure 11:
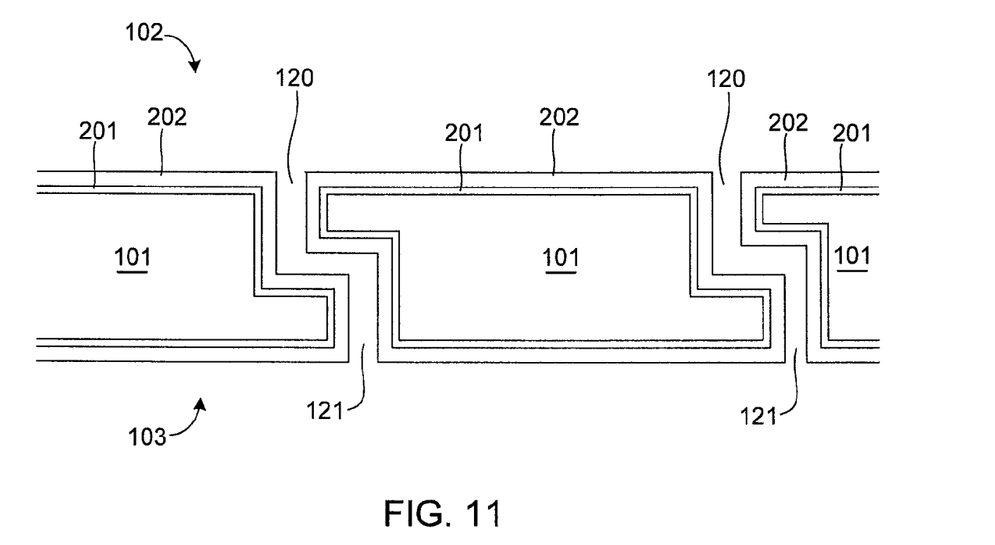
FIGS. 11 and 12 show cross-sections schematically illustrating a method of manufacturing solar cells in accordance with another embodiment of the present invention.

The above-described sliver cell has doped regions 124 and 125, i.e., base and emitter, in the wafer 101. Alternatively, the sliver cell may also be manufactured with doped regions formed external to the wafer 101. The doped regions may be in a layer of material formed over the wafer 101. The processing steps are otherwise the same as in FIGS. 1-9. For example, FIG. 11 may follow from FIG. 2. In FIG. 11, a thin oxide layer 201 is formed on the surface of the wafer 101. The oxide layer 201 may comprise silicon dioxide thermally grown to a thickness less than or equal to 40 Angstroms (e.g., between 5 to 40 Angstroms, preferably 10 Angstroms) on the surfaces of the wafer 101. Thereafter, a polysilicon layer 202 is formed on the oxide layer 201. The polysilicon layer 202, which is undoped at this stage, provides a layer of material where doped regions are to be formed. From FIG. 11, processing continues as in FIGS. 4-9 taking into account the presence of the oxide layer 201 and the polysilicon layer 202 on each sliver 130.

Generally speaking, as before, a two layer process having a P-type doped or N-type doped layer capped by an undoped capping layer may be used in lieu of a single P-type or N-type doped layer.

Figure 12:
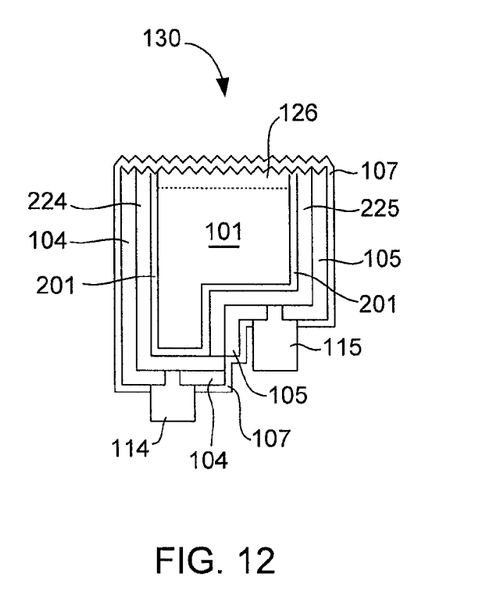

Referring to FIG. 12, the subsequent thermal drive-in step results in N-type dopants from the dopant source 124 and P-type dopants from the dopant source 125 diffusing into the polysilicon layer 202. The portion of the polysilicon layer 202 where the N-type dopants diffused into results in (and is thus relabeled as) an N-type doped region 224. The portion of the polysilicon layer 202 where the P-type dopants diffused into results in (and is thus relabeled as) a P-type doped region 225. The N-type doped region 224 and the P-type doped region 225 are the base and emitter, respectively, of the sliver cell in this example where the wafer 101 comprises an N-type silicon wafer. Unlike the sliver cell of FIG. 9, the base and emitter of the sliver cell of FIG. 12 are external to the wafer 101. In the example of FIG. 12, the base and emitter are formed in the polysilicon layer 202.

Still referring to FIG. 12, the metal contact finger 114 is formed in a contact hole going through the silicon nitride layer 107 and silicon dioxide layer 104 to electrically contact the N-type doped region 224. Similarly, the metal contact 115 is formed in a contact hole going through the silicon nitride layer 107 and silicon dioxide layer 105 to electrically contact the P-type doped region 225. The metal contacts 114 and 115 may comprise interdigitated metal contacts, and are formed on the back side of the sliver 130.

In another aspect of the present disclosure, metal contacts of back contact solar cells are formed using a process wherein the solar cells are attached to a superstrate, such as a sheet of polymer film, during metallization. This improved metallization process is now explained beginning with FIG. 13 using sliver cells as an example. It is to be noted that the improved metallization process may be employed to metallize solar cells in general.

Figure 13:
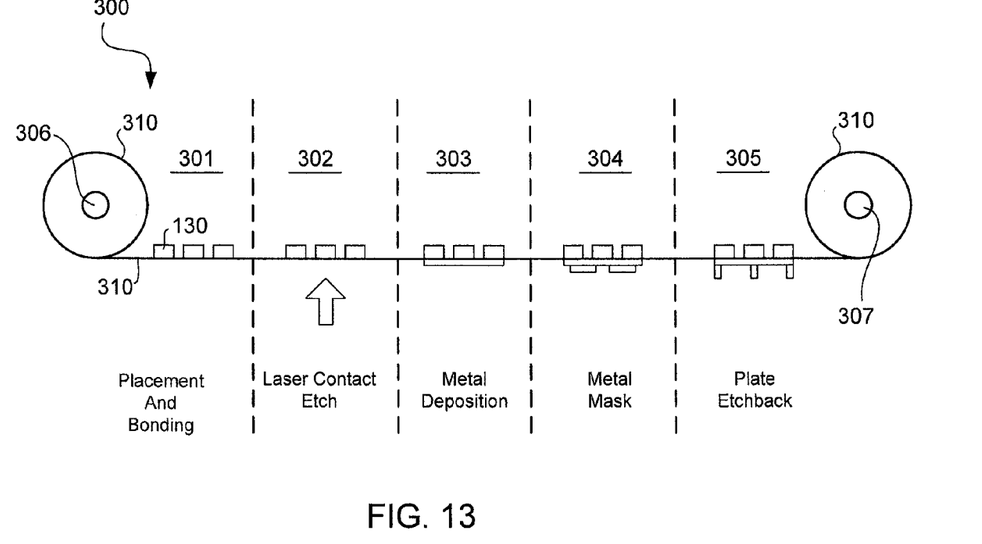
FIG. 13 schematically illustrates a metallization process for solar cells in accordance with an embodiment of the present invention.

FIG. 13 schematically illustrates a metallization process 300 for solar cells in accordance with an embodiment of the present invention. The metallization process 300 is a process for forming metal contacts that electrically connect to doped regions of the solar cells. In the example of FIG. 13, the process 300 comprises five process modules, namely process modules 301, 302, 303, 304, and 305. The process modules 301-305 are performed in sequential fashion in this example. However, as can be appreciated, the number of process modules of the process 300 and the order in which they are performed may vary depending on the particulars of the process or solar cells to be metallized.

In the process module 300-1, slivers 130 (see FIG. 9) are attached front side up on a superstrate comprising a sheet of polymer film 310. Only one sliver 130 is labeled in FIG. 13 for clarity of illustration. The polymer film 310 may comprise polyimide, for example. Given the relatively small size of the slivers 130, the process 300 may be a roll-to-roll process, such as those used for metal post bonding. That is, the polymer film 310 may be unrolled from a roll 306 and rolled onto a roll 307 as the slivers 130 undergo processing from process module 301 to process module 305. The polymer film 310 is thus used advantageously as a transport during the metallization process. This is particularly advantageous in high volume manufacturing of sliver cells because of the relatively small size of sliver cells, making them difficult to handle and transport during high volume metallization.

The polymer film 310 may be selected or configured for various purposes including white reflector for light trapping, moisture barrier, adhesion, and visual/aesthetic (e.g., as a cloaking tape). Preferably, the polymer film 310 is resistant to chemicals and materials used during the metallization process (e.g., hydrofluoric acid or plating resistant).

FIGS. 14-18 schematically show further details of the process modules 301-305, respectively, in accordance with an embodiment of the present invention. FIGS. 13-18 are not to scale. Only one sliver 130 is shown in FIGS. 14-18 for clarity of illustration. In practice, as shown in FIG. 13, a plurality of slivers 130 are processed while being supported on the same sheet of polymer film 310. The slivers 130 may be separated after metallization or a manufacturing step after metallization.

Figure 14:
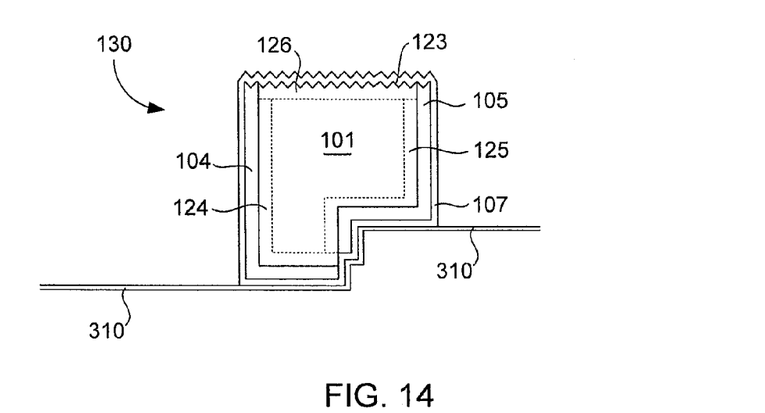
FIG. 14 schematically illustrates a process module where solar cells are attached to a sheet of polymer film in the process of FIG. 13, in accordance with an embodiment of the present invention.

FIG. 14 shows a sliver 130 in the process module 301. The sliver 130 is placed on the sheet of polymer film 310 such that the textured surface 123 on the front side is facing up. The back side of the sliver 130 may be bonded to the polymer film 310 using a hot rolling process. In the example of FIG. 14, the surface of the silicon nitride layer 107 on the back side is bonded to the polymer film 310 using an organic adhesive. As can be appreciated, the entire back side surface of the sliver 130 does not necessarily have to conform to the polymer film 310. In subsequent process modules, metal contacts will be formed through the silicon nitride layer 107, silicon dioxide layer 104, and silicon dioxide layer 105 to make electrical connection to the N-type doped region 124 and P-type doped region 125. As in FIG. 9, the sliver 130 has a sliver of a silicon wafer 101 as a substrate. A front surface field 126 is formed on the front side of the sliver 130.

Figure 15:
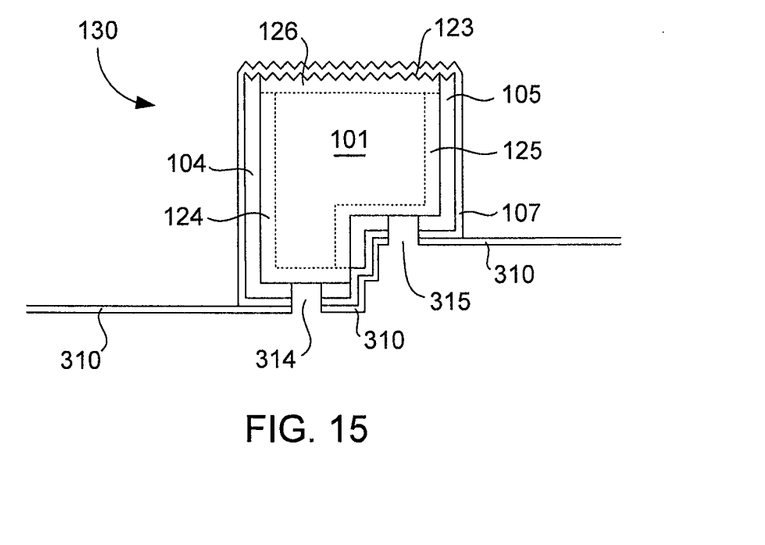
FIG. 15 schematically illustrates a process module where contact holes of solar cells are formed through the sheet of polymer film in the process of FIG. 13, in accordance with an embodiment of the present invention.

FIG. 15 shows the sliver 130 in the process module 302, following the process module 301. In the example of FIG. 15, a contact hole 314 is formed through the polymer film 310, silicon nitride 107, and silicon dioxide layer 104 to expose the N-type doped region 124. Similarly, a contact hole 315 is formed through the polymer film 310, silicon nitride 107, and silicon dioxide layer 105 to expose the P-type doped region 125. The contact holes 314 and 315 may be formed by laser etching, for example.

Alternatively, the polymer film 310 may be used as a masking layer for etching the silicon nitride 107 and silicon dioxide layers 104 and 105 to form the contact holes 314 and 315. For example, a laser may be used to pattern the polymer film 310 to expose regions on the back side of the sliver 130 where the contact holes 314 and 315 will be formed. A wet or dry etch process may then be used to etch the silicon nitride 107 and silicon dioxide layers 104 and 105, stopping on the substrate 101.

Figure 16:
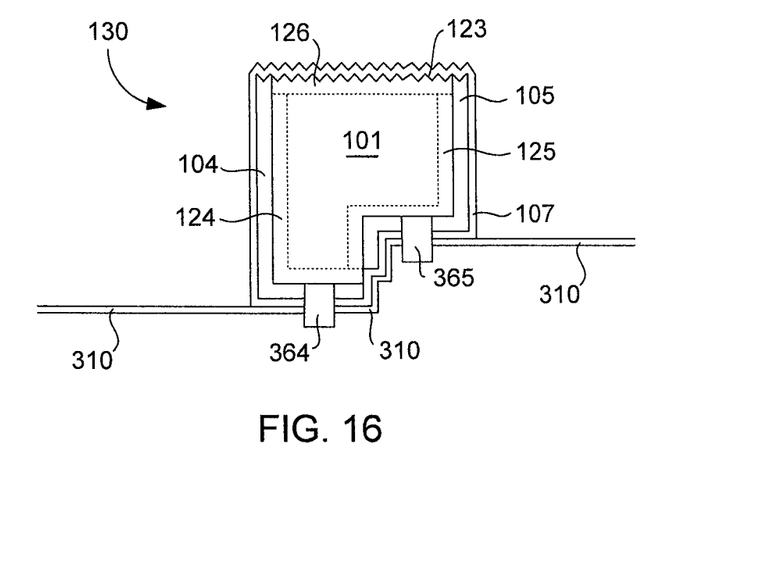
FIG. 16 schematically illustrates a process module where metals are deposited in contact holes of solar cells in the process of FIG. 13, in accordance with an embodiment of the present invention.

FIG. 16 shows the sliver 130 in the process module 303, following the process module 302. In the example of FIG. 16, metals 364 and 365 are formed in the contact holes 314 and 315, respectively. The metals 364 and 365 may be formed by sputtering, for example. Metals 364 and 365 may each be a single layer or multi-layer metal stack. In one embodiment, each of the metals 364 and 365 comprises a metal stack comprising a first layer of aluminum directly on the substrate 101, a second layer of titanium-tungsten (serving as a barrier layer) directly on the first layer of aluminum, and a third layer of copper directly on the second layer of titanium-tungsten. The third layer of copper serves as a seed layer for subsequent electroplating of copper in the process module 305.

Figure 17:
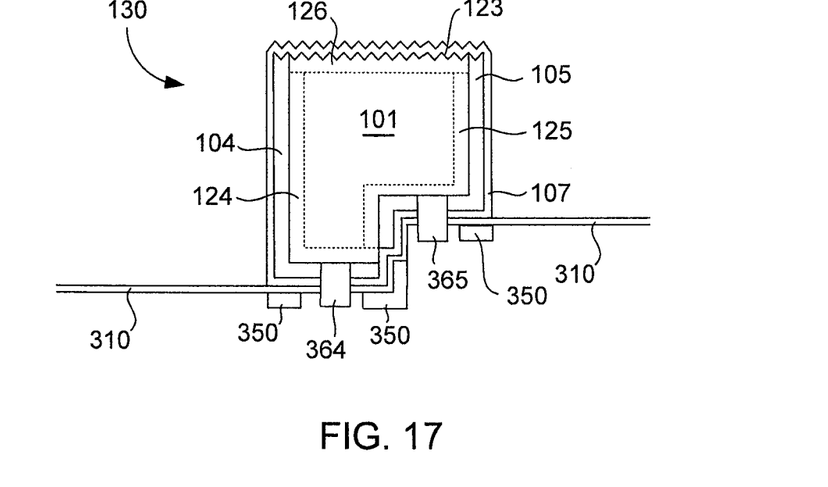
FIG. 17 schematically illustrates a process module where a mask for an electroplating process is formed on the sheet of polymer film in the process of FIG. 13, in accordance with an embodiment of the present invention.

FIG. 17 shows the sliver 130 in the process module 304, following the process module 303. In the example of FIG. 17, a mask 350 is formed on the polymer film 310. The mask 350 protects portions of the polymer film 310 during electroplating of the metals 364 and 365 in the process module 305. The mask 350 may comprise a resist material and may be formed using lithography techniques. Alternatively, the mask 350 may comprise an organic material that is formed on the polymer film 310 by ink jet printing.

Figure 18:
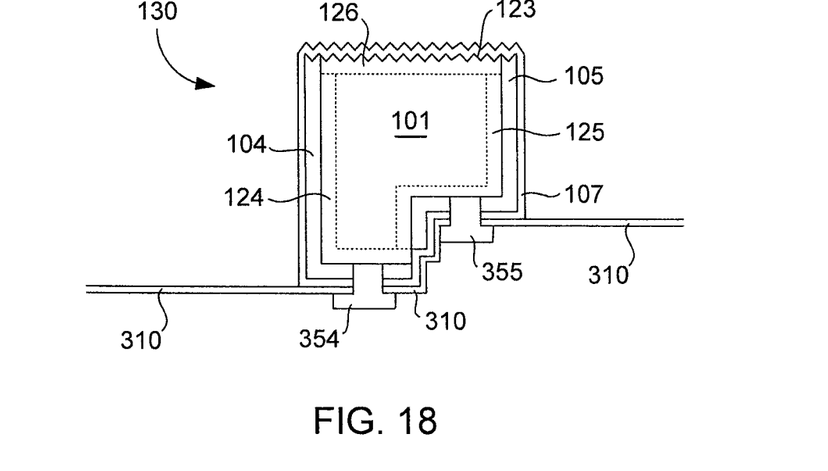
FIG. 18 schematically illustrates a process module where metals are electroplated in the process of FIG. 13, in accordance with an embodiment of the present invention.

FIG. 18 shows the sliver 130 in the process module 305, following the process module 304. The process module 305 electroplates the seed layer to increase the conductivity of the metals. In the example of FIG. 18, the metals 364 and 365 are relabeled as metal contacts 354 and 355 to indicate the electroplating. In the embodiment where the top portion of the metals 364 and 365 comprises a copper seed layer, the process module 304 comprises a copper electroplating process to form the metal contacts 354 and 355. In one embodiment, the metal contacts 354 and 365 comprise interdigitated metal contacts. An etch back process may follow the electroplating to further pattern the metal contacts 354 and 355 as appropriate. The mask 350 is removed after the electroplating or etch back process.

Instead of forming the mask 350 in the process module 304 to perform the electroplating process in the process module 305, a laser etch process may instead be used to form interdigitated metal contacts after the electroplating process. That is, the electroplating process in the module 305 may be performed without a mask. After the electroplating process, a laser etch process may be used to selectively pattern the metal contacts 354 and 355.

After formation of the metal contacts 354 and 355, the sliver 130 may be separated from the other slivers using a suitable cutting technique (e.g., using a laser). Electrical tests may thereafter be performed on the sliver 130. Remaining portions of the polymer film 310 in the sliver 130 serve as a dielectric layer of the sliver cell.

The above described technique of using a superstrate for metallization may be employed on solar cells of varying sizes, from sliver cells to full-size or quarter size wafer solar cells. The use of a superstrate for metallization allows for high volume metallization of relatively small solar cells (e.g., sliver cells) and production efficiency in general. The superstrate also provides improved mechanical support for strings of solar cells as now explained with reference to FIG. 19.

Figure 19:
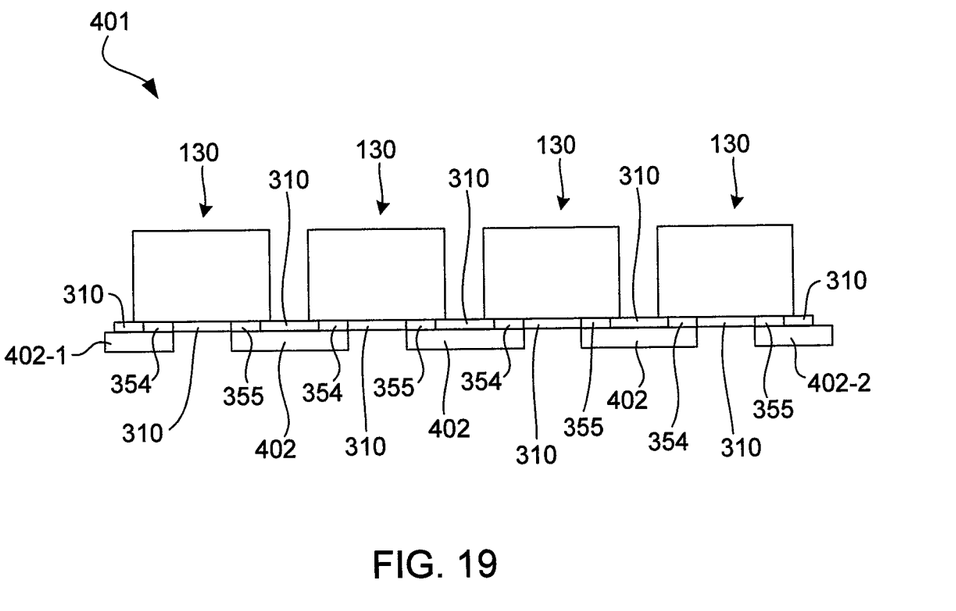
FIG. 19 schematically shows a solar cell array in accordance with an embodiment of the present invention.

FIG. 19 schematically shows a solar cell array 401 in accordance with an embodiment of the present invention. The solar cell array 401 comprises a string of solar cells, which in the example of FIG. 19 is a string of slivers 130. As can be appreciated, the solar cell array 401 may have strings of solar cells other than sliver cells. In particular, the solar cell array 401 may utilize full-size or quarter-size wafer solar cells.

In the example of FIG. 19, interconnects 402 electrically connect the slivers 130 in series. More specifically, an interconnect 402 electrically connects a metal contact 355 of one sliver 130 to a metal contact 354 of another sliver 130 to form a series connection. The ends of the string of solar cells of the solar cell array 401 (see 402-1 and 402-2) may be connected to an external electrical circuit drawing current from the string of slivers 130. The sheet of polymer 310, which serves as the superstrate in this example, is continuous (i.e., uncut) in the solar cell array 401 to provide mechanical support to the solar cells in the module. The sheet of polymer 310 advantageously allows for formation of strings of solar cells without necessarily having to use solder pads, which increase production cost and adversely affect efficiency. Furthermore, the sheet of polymer film 310 allows the string of solar cells to be formed together without necessarily having solder joints directly between solar cells.

Methods and apparatus for metallization of solar cells have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method for metallization of solar cells, the method comprising:
   unrolling a sheet of polymer film in a first roll and rolling the sheet of polymer film into a second roll;
   attaching a plurality of solar cells on the sheet of polymer film;
   forming contact holes through the sheet of polymer film to expose doped regions of the solar cells;
   forming metals in the contact holes to electrically connect to the exposed doped regions of the solar cells; and
   electroplating the metals to form metal contacts, wherein the metal contacts are formed through the sheet of polymer film while the solar cells are still attached to the sheet of the polymer film and as the sheet of polymer film is unrolled from the first roll and rolled onto the second roll.

2. The method of claim 1 wherein attaching the plurality of solar cells on the sheet of polymer film comprises:
   bonding back sides of the plurality of solar cells on the sheet of polymer film such that front sides of the solar cells are facing up relative to the sheet of polymer film during metallization, the front sides being opposite the back sides and face the sun to collect solar radiation during normal operation.

3. The method of claim 1 further comprising:
   after forming the contact holes but prior to forming the metals in the contact holes, forming masks on the sheet of polymer film to protect portions of the sheet of polymer film during the electroplating of the metals.

4. The method of claim 1 wherein the metals are formed in the contact holes by sputtering.

5. The method of claim 1 wherein each of the solar cells comprises a sliver of silicon wafer having a front side surface from along the thickness of the wafer, the front side surface being configured to face the sun to collect solar radiation during normal operation.

6. The method of claim 1 wherein the metal contacts comprise copper.

7. The method of claim 1 wherein the metal contacts electrically connect to P-type doped and N-type doped regions of the solar cells on the back sides of the solar cells.

8. The method of claim 1 wherein the polymer film comprises polyimide.

9. A method for metallization of solar cells, the method comprising:
   unrolling a superstrate in a first roll and rolling the superstrate into a second roll;
   attaching a plurality of solar cells on the superstrate;
   forming contact holes through the superstrate;
   forming metal contacts of the solar cells while the solar cells are attached to the superstrate and while the superstrate is unrolled from the first roll and rolled onto the second roll; and
   separating a solar cell from other solar cells that are also attached to the superstrate during formation of the metal contacts of the solar cells.

10. The method of claim 9 wherein the solar cell is attached to the superstrate using an adhesive.

11. The method of claim 9 wherein forming the metal contacts of the solar cell comprises:
   depositing metals in the contact holes; and
   electroplating the metals to form the metal contacts.

12. The method of claim 9 wherein the superstrate comprises polymer film.

13. The method of claim 9 wherein the solar cell has a front side surface from along a thickness of a silicon wafer.

* * * * *